(12) United States Patent
Kabasawa et al.

(10) Patent No.: US 9,040,912 B2
(45) Date of Patent: May 26, 2015

(54) INFRARED SENSING ELEMENT AND INFRARED IMAGING DEVICE

(75) Inventors: Hidetoshi Kabasawa, Saitama (JP); Minoru Wakabayashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 934 days.

(21) Appl. No.: 13/095,441

(22) Filed: Apr. 27, 2011

(65) Prior Publication Data

US 2011/0267473 A1    Nov. 3, 2011

(30) Foreign Application Priority Data

Apr. 28, 2010   (JP) ................................. 2010-104289

(51) Int. Cl.
| | | |
|---|---|---|
| *G01J 5/00* | (2006.01) | |
| *H01L 37/02* | (2006.01) | |
| *G01J 5/02* | (2006.01) | |
| *G01J 5/04* | (2006.01) | |
| *G01J 5/34* | (2006.01) | |

(52) U.S. Cl.
CPC ............. *H01L 37/025* (2013.01); *G01J 5/0235* (2013.01); *G01J 5/024* (2013.01); *G01J 5/046* (2013.01); *G01J 5/34* (2013.01)

(58) Field of Classification Search
CPC ......... G01J 5/0235; G01J 5/046; G01J 5/024; G01J 5/34; H01L 37/025
USPC .......... 250/338.1; 348/164, E05.09; 257/467, 257/E29.347; 977/755
See application file for complete search history.

(56) References Cited

U.S. PATENT DOCUMENTS

| | | | | |
|---|---|---|---|---|
| 3,816,750 | A | * | 6/1974 | Liu ............................ 250/338.3 |
| 5,087,816 | A | * | 2/1992 | Robin et al. ............... 250/338.3 |
| 5,536,963 | A | * | 7/1996 | Polla ............................. 257/417 |
| 5,684,302 | A | * | 11/1997 | Wersing et al. ............ 250/338.3 |
| 6,121,614 | A | * | 9/2000 | Taniguchi et al. ......... 250/338.3 |
| 2005/0006584 | A1 | * | 1/2005 | Kawakubo et al. ........ 250/338.2 |
| 2005/0087689 | A1 | * | 4/2005 | Tomozawa et al. ........ 250/338.3 |
| 2007/0230191 | A1 | * | 10/2007 | Komuro et al. ............... 362/341 |
| 2010/0187466 | A1 | * | 7/2010 | Wang et al. ............ 252/62.9 PZ |

FOREIGN PATENT DOCUMENTS

| | | |
|---|---|---|
| JP | 06-109536 | 4/1994 |
| JP | 08-035880 | 2/1996 |
| JP | 09-500234 | 1/1997 |

(Continued)

OTHER PUBLICATIONS

Office action issued in connection with Japanese Patent Application No. 2010-104289, dated Apr. 22, 2014. (5 pages).

(Continued)

*Primary Examiner* — David Porta
*Assistant Examiner* — Gisselle Gutierrez
(74) *Attorney, Agent, or Firm* — K&L Gates LLP

(57) ABSTRACT

An infrared sensing element is provided and includes a substrate, a supporting electrical insulating layer formed on the substrate; a first electrode formed on the supporting electrical insulating layer, a pyroelectric layer formed on the first electrode, and a second electrode formed on the pyroelectric layer. The pyroelectric layer has a light receiving area of $1 \times 10^2$ to $1 \times 10^4$ μm$^2$, has a thickness of 0.8 to 10 μm, and contains therein a compound expressed as Pb(Zr$_x$Ti$_{1-x}$)O$_3$, where $0.57 < x < 0.93$ as a principal component.

15 Claims, 8 Drawing Sheets

(56) References Cited

FOREIGN PATENT DOCUMENTS

| | | |
|---|---|---|
| JP | 10-041186 | 2/1998 |
| JP | 2006-349601 | 12/2006 |

OTHER PUBLICATIONS

Chinese Office action issued Sep. 18, 2014, for corrresponding Chinese Appln. No. 201110101169.2.

* cited by examiner

FIG.14
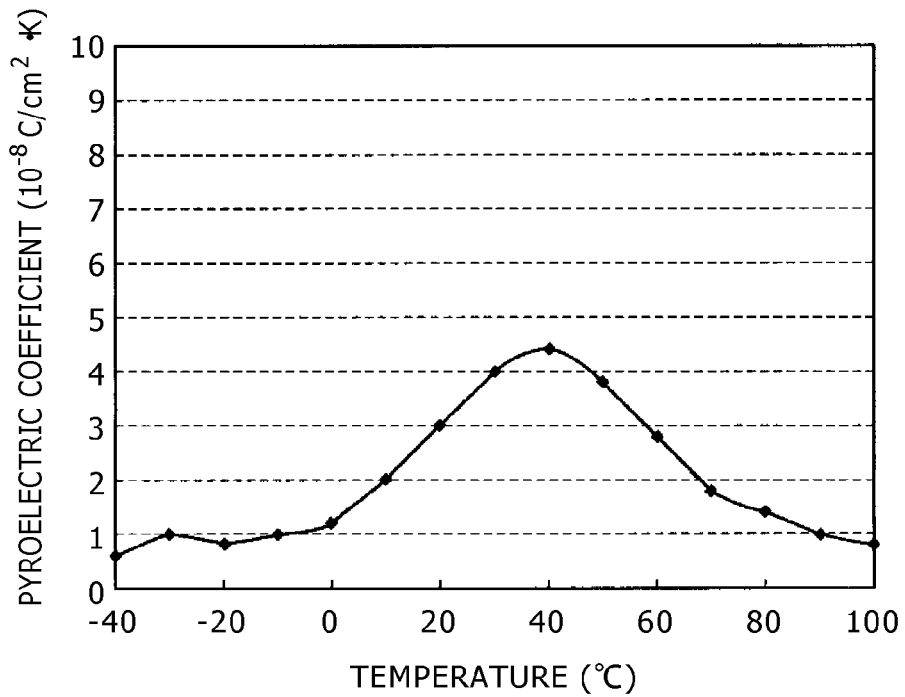
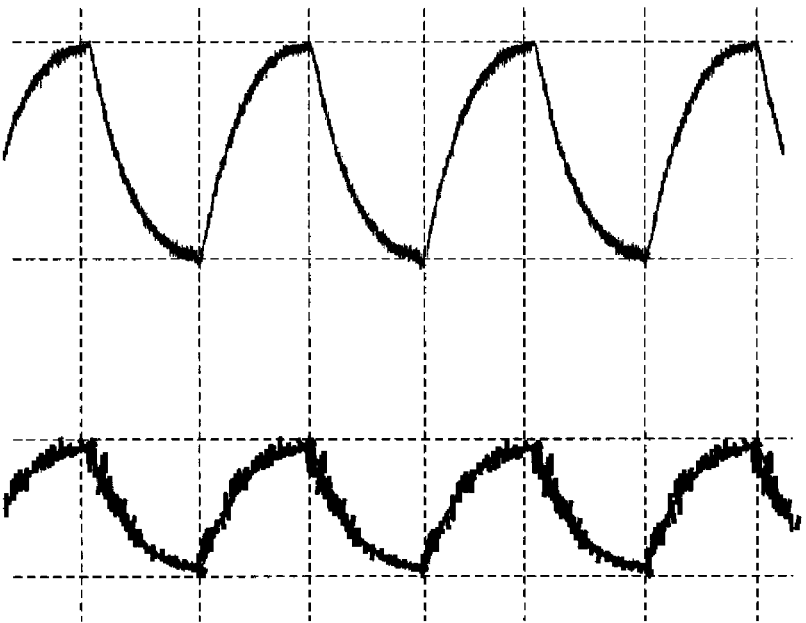
FIG.15A
FIG.15B

INFRARED SENSING ELEMENT AND INFRARED IMAGING DEVICE

CROSS REFERENCES TO RELATED APPLICATIONS

The present application claims priority to Japanese Priority Patent Application JP 2010-104289 filed with the Japan Patent Office on Apr. 28, 2010, the entire content of which is hereby incorporated by reference.

BACKGROUND

The present disclosure relates to a pyroelectric type infrared sensing element in which intrinsic polarization is changed by radiation of an infrared ray to generate surface electric charges, and an infrared imaging device using the same.

Sensors for sensing infrared rays are roughly classified into two kinds of sensors called a quantum type infrared sensing element and a heated type infrared sensing element in terms of the operating principles. In particular, the heated type infrared sensing element in which an incident infrared ray is absorbed to change a temperature of a light receiving element, thereby sensing the infrared ray has an advantage such that cooling is unnecessary. For this reason, in recent years, the heated type infrared sensing element has been utilized as an imager of an infrared imaging device (thermography), or a human-sensor with which an eco product or the like is loaded.

It is known that the heated type infrared sensing elements, for example, are classified into the following three kinds of infrared sensing elements. One of them is a thermopile type infrared sensing element to which a thermocouple for causing the Seebeck effect is connected. Another one of them is a bolometer type infrared sensing element which utilizes a change in resistance value due to temperature rise. Also, there is known a pyroelectric type infrared sensing element which generates surface electric charges due to a change in intrinsic polarization of a pyroelectric element.

In the pyroelectric type infrared sensing element, a research for devising the kinds and compositions of the pyroelectric materials, thereby enhancing a pyroelectric coefficient as an efficiency of generation of the surface electric charges due to a temperature change, and a research for efficiently absorbing an incident infrared ray are carried out for the purpose of enhancing the sensitivity for the infrared ray. For example, an infrared sensing portion using a pyroelectric effect thin film is described as an infrared temperature sensor for measuring a temperature in a non-contact style in Japanese Patent Laid-Open No. 2006-349601 (hereinafter referred to as Patent Document 1). Also, a construction is proposed in which a member for shielding an infrared ray is arranged so as to face the infrared sensing portion, and a minute window is provided in the shielding member, thereby making it possible to measure a temperature of a minute area.

SUMMARY

The infrared temperature sensor described in Patent Document 1 has a construction that one pyroelectric element is used in order to precisely measure the temperature of the minute area. On the other hand, in the case where a large number of pyroelectric elements z are arranged, thereby carrying out the imaging by using the infrared ray, a problem is practically caused when the sensitivity is merely enhanced. For example, the pyroelectric element is treated as one pixel, a pixel area is miniaturized, and thus the pixels are arranged in an array of about several hundreds×about several hundreds, whereby it is possible to carry out the imaging using ten thousands or more of pixels by using the infrared ray. Such imaging having the high resolution based on the infrared ray sensing, for example, is desired as a technique for carrying out the more highly functional discrimination in the field of the human-sensor described above.

However, the infrared imaging device in which a large number of sensing elements each composed of the pyroelectric element are arranged in an array does not reach mass production in the present circumstances because of the problem due to the miniaturization. That is to say, when the infrared sensing element using the pyroelectric elements is miniaturized to about 100 μm or less in one piece, a light receiving area for the infrared ray becomes small. Therefore, an energy inputted to the light receiving area is also reduced, and thus an influence of a noise exerted on an output becomes large.

It is therefore desire to provide a pyroelectric type infrared sensing element in which even when a light receiving area of the infrared sensing element used as a pixel is reduced, an influence of a noise is reduced, and an infrared imaging device using the same.

According to an embodiment, there is provided an infrared sensing element including: a substrate; a supporting electrical insulating layer formed on the substrate; a first electrode formed on the supporting electrical insulating layer; a pyroelectric layer formed on the first electrode; and a second electrode formed on the pyroelectric layer, in which the pyroelectric layer has a light receiving area of $1\times10^2$ to $1\times10^4$ μm$^2$, has a thickness of 0.8 to 10 μm, and contains therein a compound expressed as $Pb(Zr_xTi_{1-x})O_3$ ($0.57<x<0.93$) as a principal component.

According to another embodiment, there is provided an infrared imaging device including: plural pyroelectric type infrared sensing elements; a light condensing portion configured to condense an infrared ray to the plural pyroelectric type infrared sensing elements; an electric charge controlling portion configured to control output of electric charges obtained in the plural pyroelectric type infrared sensing elements by radiation of the infrared ray; and a signal processing circuit for converting outputs from the plural pyroelectric type infrared sensing elements into signals, thereby obtaining an infrared image, each of the plural pyroelectric type infrared sensing elements including: a substrate; a supporting electrical insulating layer formed on the substrate; a first electrode formed on the supporting electrical insulating layer; a pyroelectric layer formed on the first electrode; and a second electrode formed on the pyroelectric layer, in which the pyroelectric layer has a light receiving area of $1\times10^2$ to $1\times10^4$ μm$^2$, has a thickness of 0.8 to 10 μm, and contains therein a compound expressed as $Pb(Zr_xTi_{1-x})O_3$ ($0.57<x<0.93$) as a principal component.

When the pyroelectric type infrared sensing element is miniaturized in such a way that in particular, the light receiving area thereof is set in the range of $1\times10^2$ to $1\times10^4$ μm$^2$, and the thickness thereof is set in the range of 0.8 to 10 μm, the output due to the piezoelectric property which the material thereof has exerts an influence on the noise. When the light receiving area is shrunk to miniaturize the pixel, the output due to the piezoelectric property causes the large noise relative to the video signal output based on the infrared ray. This reason is because when the pixel is miniaturized, that is, the light receiving area of the infrared sensing element is shrunk, the rigidity of the infrared sensing element itself is reduced.

When the rigidity of the infrared sensing element is reduced, the outputs (piezoelectric outputs) due to the piezoelectric property are readily generated by a strain caused by an external stress, a vibration or a temperature change. The piezoelectric outputs are all the noise when viewed in terms of the output obtained from the pyroelectric property, and thus become a serious problem for the miniaturization of the pyroelectric type infrared sensing element and thus the multiple pixel promotion for the infrared imaging device. In addition, for enhancing the sensitivity of the pyroelectric type infrared sensing element, it is also effective to reduce the permittivity as well as to enhance the pyroelectric property.

For this reason, the embodiment suppresses the permittivity and enhances the pyroelectric efficiency while the pyroelectric property is enhanced, and specifies the composition ratio for suppression of the piezoelectric property in terms of the material of the pyroelectric layer in the miniature pyroelectric type infrared sensing element for which the multiple pixel promotion can be carried out. As a result, it becomes possible to capture the infrared image with the multiple pixels and high resolution by using the pyroelectric type infrared sensing elements.

As set forth hereinabove, according to the embodiment, even when the pixel size is shrunk by reducing the light receiving area of the infrared sensing element, the pyroelectric efficiency is ensured. Also, the satisfactory sensitivity based on the S/N ratio is obtained by reducing the piezoelectric efficiency causing the noise. As a result, it is possible to capture the infrared image with the high resolution and the satisfactory sensitivity.

Additional features and advantages are described herein, and will be apparent from the following Detailed Description and the figures.

BRIEF DESCRIPTION OF THE FIGURES

FIG. 14 is a graph representing a relationship between a temperature and a pyroelectric coefficient in $Pb(Zr_{0.6}Ti_{0.4})O_3$; and FIGS. 15A and 15B are a waveform chart showing an output waveform in an example of the present invention and a waveform chart showing an output waveform in a comparison example, respectively.

DETAILED DESCRIPTION

Hereinafter, an infrared sensing element according to a first embodiment, and an infrared imaging device according to a second embodiment will be described in detail with reference to the accompanying drawings. Although the present embodiments are described by exemplifying the infrared imaging device in which the infrared sensing elements are two-dimensionally arranged, the present embodiments are by no means limited thereto. That is to say, the present embodiments also contain the case where the infrared sensing elements are one-dimensionally or three-dimensionally laminated. The description will be given below in accordance with the following order.

Figure 1:
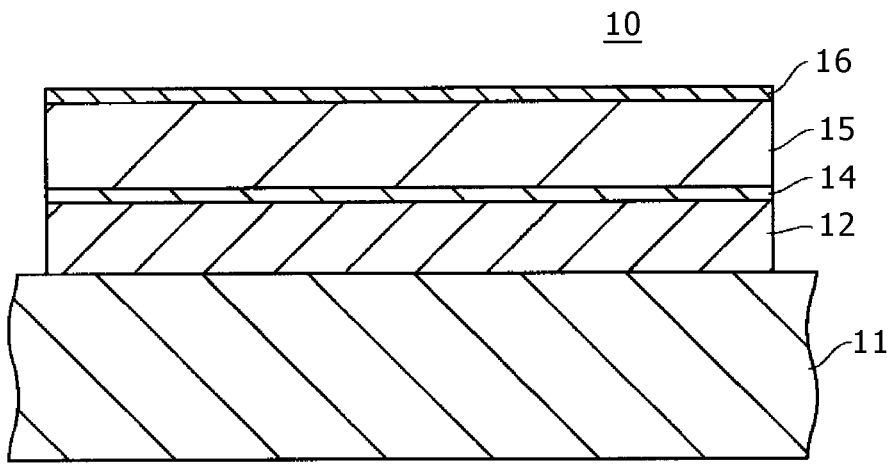
FIG. 1 is a cross sectional view of an infrared sensing element according to a first embodiment.

1. First Embodiment (Infrared Sensing Element)
   (1) Basic Structure of Infrared Sensing Element
   (2) Infrared Sensing Element of First Change (Structure that Intermediate Layer is Provided between Substrate and First Electrode)
   (3) Infrared Sensing Element of Second Change (Structure that Space Portion is Provided)
   (4) Infrared Sensing Element of Third Change (Structure that Electrode is Formed to Have Two Layers)
   (5) Infrared Sensing Element of Fourth Change (Structure that Infrared Absorbing Film is Provided)
2. Second Embodiment (Infrared Imaging Device)
   (1) Basic Configuration of Infrared Imaging Device
   (2) Infrared Imaging Device of First Change (Configuration that Temperature Controlling Portion is Provided)
3. Concrete Examples 1. First Embodiment Infrared Sensing Element (1) Basic Structure of Infrared Sensing Element FIG. 1 is a cross sectional view showing a basic structure of a pyroelectric type infrared sensing element according to a first embodiment. The pyroelectric type infrared sensing element shown in FIG. 1 is structured by laminating a substrate 11, a supporting electrical insulating layer 12, a first electrode 14, a pyroelectric layer 15, and a second electrode 16 in this order. Although a Si wafer or the like, for example, is suitable for the substrate 11, the present invention is by no means limited thereto. That is to say, a material such a MgO single crystal can be utilized for the substrate 11 as long as the material does not exert an influence on a pyroelectric property which the pyroelectric layer 15 has. In addition, an insulating material such as $SiO_2$ having a low thermal conductivity can be utilized as a material of the supporting electrical insulating layer 12. The supporting electrical insulating layer 12 is formed by utilizing a thermal oxidation method, a Chemical Vapor Deposition (CVD) method or the like. The material of the supporting electrical insulating layer 12 is preferably a material whose thermal conductivity is lower than that of the material of the substrate 11. The material having the low thermal conductivity is used as the material of the supporting electrical insulating layer 12, whereby the heat of the pyroelectric layer 15 formed above the supporting electrical insulating layer 12 is made to be hardly escaped, and thus the reduction of the sensitivity can be suppressed. In addition, for causing the crystal orientation of the pyroelectric layer 15 formed on the first electrode 14 to be excellent, preferably, a conductive material having the crystal orientation is used as at least an uppermost surface layer of the first electrode 14. For such a material, Pt, for example, is suitable. In addition, preferably, a material of the second electrode 16 is a conductive material which is low in infrared ray reflectivity and is low in heat storage property. Thus, Cr, Pt or the like can be used as the material of the second electrode 16. Each of the first and second electrodes is formed by utilizing a sputtering method or the like.

Also, the infrared sensing element 10 according to the first embodiment is structured in such a way that a light receiving area thereof is set in the range of $1\times10^2$ to $1\times10^4$ μm². That is to say, of a surface area of the pyroelectric layer 15 provided in one element, an area of a portion becoming the light receiving area is set in the range of $1\times10^2$ to $1\times10^4$ μm². The infrared sensing elements 10 each having such a minute light receiving area and, for example, arranged by about several tens to about several hundreds in terms of one direction are two-dimensionally disposed. Thus, about several tens to about several hundreds of thousands of the infrared sensing elements 10 can be provided as a whole. Also, multiple pixel promotion is carried out, whereby the resolution can be dramatically enhanced as compared with the existing case. Therefore, not only it is possible to sense merely presence or absence of the infrared ray by using the human-sensor or the like, but also it is possible to capture a clearer infrared image. In particular, since it is possible to discriminate a difference in shape of an object to be sensed in addition to a size of the object to be sensed, the infrared sensing element 10 can be applied to various kinds of fields such as a device for measuring and controlling a manufacturing line, and a medical and diagnostic device in addition to a device for sensing the human body.

In addition, a thickness of the pyroelectric layer 15 is set in the range of 0.8 to 10 μm. When the pyroelectric type infrared sensing element is manufactured by utilizing the existing method, pyroelectric thin films each having a thickness of about 100 μm are cut out from a bulk pyroelectric material having about 1 mm in one side to be utilized for the infrared sensing elements. The pyroelectric layer 15 used in the infrared sensing element of the first embodiment is as very thin as 1/10 or less of each of the pyroelectric thin films cut out from the bulk material in such a manner. In the case where several hundreds to several hundreds of thousands of the pixels are arranged so as for one infrared sensing element 10 to correspond to one pixel as described above, it is difficult to precisely arrange the elements cut out from the bulk material as with the existing case with the shapes thereof being uniformized. To this end, it is preferable to adopt a manufacturing method based on a film deposition process such as the sputtering or the CVD. In the case where the pyroelectric layer 15 is formed by utilizing the film deposition process, when the thickness of the pyroelectric layer 15 exceeds 10 μm, the crystal orientation goes out of order and also it takes too long to deposit the pyroelectric layer 15, which leads to an increase in cost. From this reason, the thickness of the pyroelectric layer 15 is set as being equal to or smaller than 10 μm. In addition, when the thickness of the pyroelectric layer 15 is set as being smaller than 0.8 μm, the sufficient pyroelectric property is not obtained, that is, the efficiency of generation of the electric charges in a phase of sensing of the infrared ray is reduced. From this reason, the thickness of the pyroelectric layer 15 is set as being equal to or larger than 0.8 μm.

Also, the pyroelectric layer 15 contains therein a compound; Lead Zirconate Titanate (PZT: Piezoelectric Zirconate Titanate) expressed by Composition Formula (1):

$$Pb(Zr_xTi_{1-x})O_3 (0.57<x<0.93) \quad (1)$$

as a principal component. In general, since the S/N ratio is reduced as the infrared sensing element 10 is further miniaturized, it is desired to enhance the pyroelectric property. A performance of the pyroelectric property can be expressed by Expression (2):

$$F=\lambda/(\epsilon C) \quad (2)$$

where F is a pyroelectric performance index, λ is a pyroelectric coefficient, is a relative permittivity, and C is specific heat.

Figure 2:
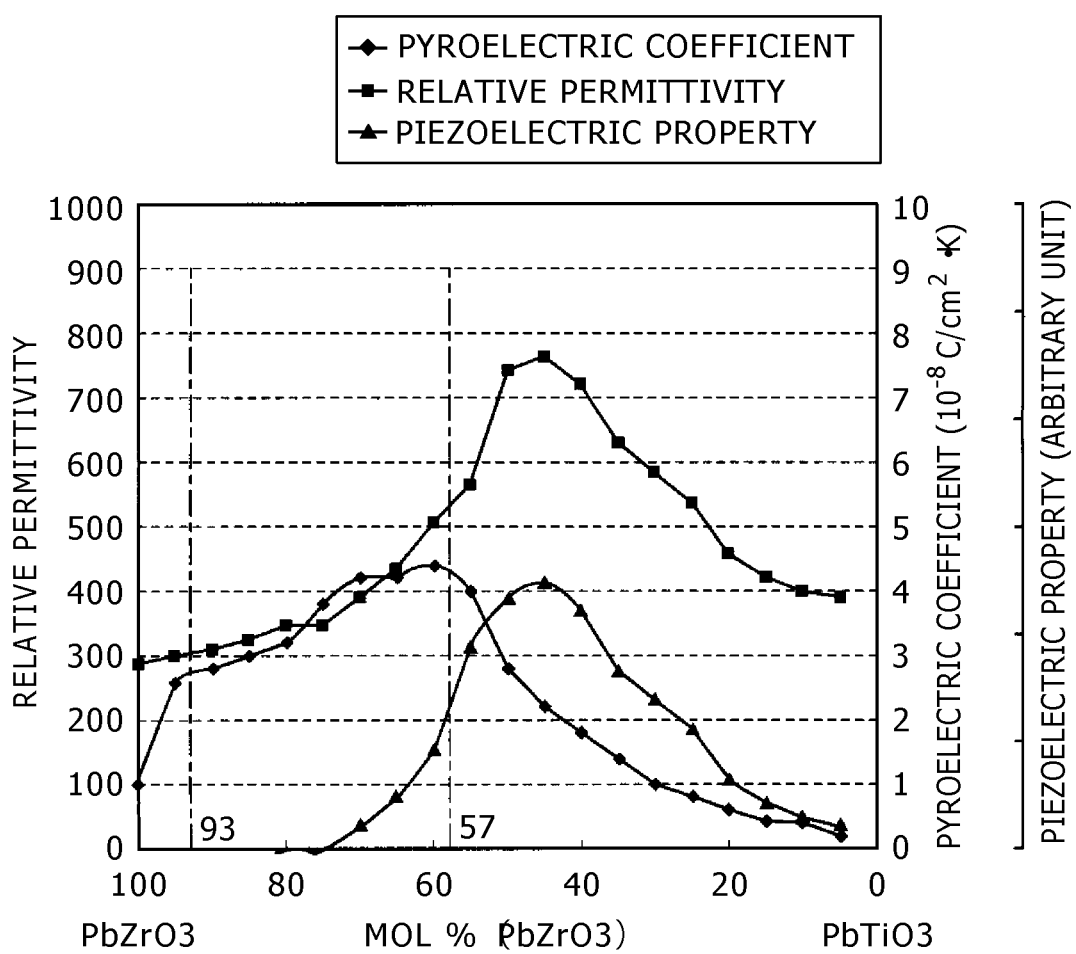
FIG. 2 is a graph representing a relationship of a pyroelectric coefficient, a relative permittivity and a piezoelectric property versus a composition of $Pb(Zr_xTi1-x)O_3$.

Here, for enhancing the pyroelectric property, the pyroelectric coefficient λ needs to be increased and the relative permittivity ϵ needs to be decreased. FIG. 2 shows changes in pyroelectric coefficient λ, relative permittivity ϵ and piezoelectric property when a composition mole ratio x of $PbZrO_3$ in the compound expressed by $Pb(Zr_xTi_{1-x})O_3$ is changed from 0 to 1. It is noted that FIG. 2 shows the case where the compound described above is formed so as to have a thickness of 3 μm and an area of 200 μm² for one pixel at a temperature of 40° C. Note that, after the generated electric charges were measured by using an FCE series ferroelectric substance evaluating apparatus manufactured by Toyo Corporation, the relative permittivity was calculated based on Expression (3):

$$\epsilon r=tC/(\epsilon_0 S) \quad (3)$$

where t is a thickness of PZT, $\epsilon_0$ is a permittivity of a vacuum, S is a light receiving area, and C is generated electric charges measured. The pyroelectric property was measured in a constant-temperature bath, and the piezoelectric property was measured by using a force gauge and a displacement gauge.

As can be seen from FIG. 2, the pyroelectric coefficient λ has a tendency to be large when the composition mole ratio x is in the range of $0.52<x<0.95$ and the relative permittivity ϵ has a tendency to be small when the composition mole ratio x is in the range of $0.55<x$. In addition, the piezoelectric property causing the noise also has a tendency to be low when the composition mole ratio x is in the range of $0.55<x$. When the piezoelectric property is not sufficiently low, the piezoelectric effect due to the strain is caused in the pyroelectric layer 15, and thus turns into the noise component which cannot be disregarded for the pyroelectric output. In particular, when the light receiving area of the pyroelectric layer 15, as described above, is set as being equal to or smaller than $1\times10^4$ μm², the influence of the piezoelectric strain is large relative to an amount of electric charges generated, that is, the infrared sensing element 10 is weak against the strain stress. Thus, the light receiving area of the pyroelectric layer 15 needs to correspond to the composition range in which the piezoelectric property is low. In addition, it was found out that since the compound for the pyroelectric layer 15 turns into an anti-ferroelectric when the composition mole ratio is in the range of $0.95<x$, the pyroelectric performance becomes abruptly unstable.

From the results described above, it is better that the compound in which the composition mole ratio x in Composition Formula (1) described above is set in the range of $0.57<x<0.93$ is used for the pyroelectric layer 15 of the infrared sensing element 10 of the first embodiment. By adopting such a composition, in spite of the miniaturized infrared sensing element 10 which is weak against the strain stress, the piezoelectric noise is reduced and thus the high pyroelectric output is obtained.

Note that, the results shown in FIG. 2 were obtained when $Pb(Zr_xTi_{1-x})O_3$ has the surface area (light receiving area) of 200 μm² and the thickness of 3 μm. However, this tendency applied to the case as well, where the light receiving area was $1\times10^2$ μm² and the thickness was 0.8 μm, as the severer conditions in the piezoelectric property. In addition, when the light receiving area is set as $1\times10^4$ μm² and the thickness is set as 10 μm, in the composition range described above, the pyroelectric coefficient λ becomes sufficiently large, the relative permittivity c becomes small, and the piezoelectric property also becomes lower. From this reason, in the first embodiment, when the light receiving area of the pyroelectric layer 15 is set in the range of $1\times10^2$ to $1\times10^4$ μm², and the thickness thereof is in the range of 0.8 to 10 μm, the composition mole ratio x described above is set in the range of $0.57<x<0.93$.

In addition, since the Curie point of the material of the pyroelectric layer 15 exerts an influence on the intrinsic polarization, more preferably, the temperature range of the usage environment is also taken into consideration. The compound expressed by Composition Formula (1) described above has such a tendency that when the ratio of Zr is made large, the Curie point gradually drops. In a word, when the ratio of Zr is made too large, the Curie point becomes low, and thus there is the possibility that the Curie point is exceeded when the temperature unexpectedly rises. For this reason, the composition is preferably selected so that the Curie point centigrade temperature has a margin which is more than twice that of the upper limit in the temperature range of the usage environment. For example, when the temperature range of the usage environment is set in the range of −15 to 80° C., the compound in which the composition mole ratio x in Composition Formula (1) described above is set in the range of $0.57<x<0.81$ is preferably made the principal component. When that range is adopted, the margin of the Curie point which is more than twice that of the upper limit in the temperature range of the usage environment can be ensured. Therefore, it is possible to obtain the pyroelectric type infrared sensing element 10 in which the pyroelectric output is high, the piezoelectric noise is low, and the temperature reliability is ensured.

Moreover, when the composition mole ratio x in Composition Formula (1) described above of the material of the pyroelectric layer 15 is set in the range of $0.57<x<0.76$, the larger margin of the Curie point can be ensured. As a result, in the actual usage environment temperature, that is, in the temperature range of −15 to 80° C., the stable pyroelectric property having the high efficiency is obtained without requiring the temperature control.

It is noted that with regard to the material of the pyroelectric layer 15, the compound described above may be mixed with a small amount of additive or impurity. For example, La, Sr, Ba, Cd or the like can be added (mixed) to the compound described above, and an upper limit of an additive amount is preferably set as being equal to or smaller than 10%. Even when the compound described above is mixed with such a material, an additive amount of additive or a small amount of impurity, similarly, the piezoelectric noise due to the miniaturization can be suppressed and the high sensitivity can be obtained as long as the addition range permits that the influence exerted on the pyroelectric property is low, the pyroelectric property is sufficiently obtained, and the piezoelectric noise is sufficiently suppressed to be low. In addition, the pyroelectric property can be enhanced depending on the addition conditions.

Figure 3:
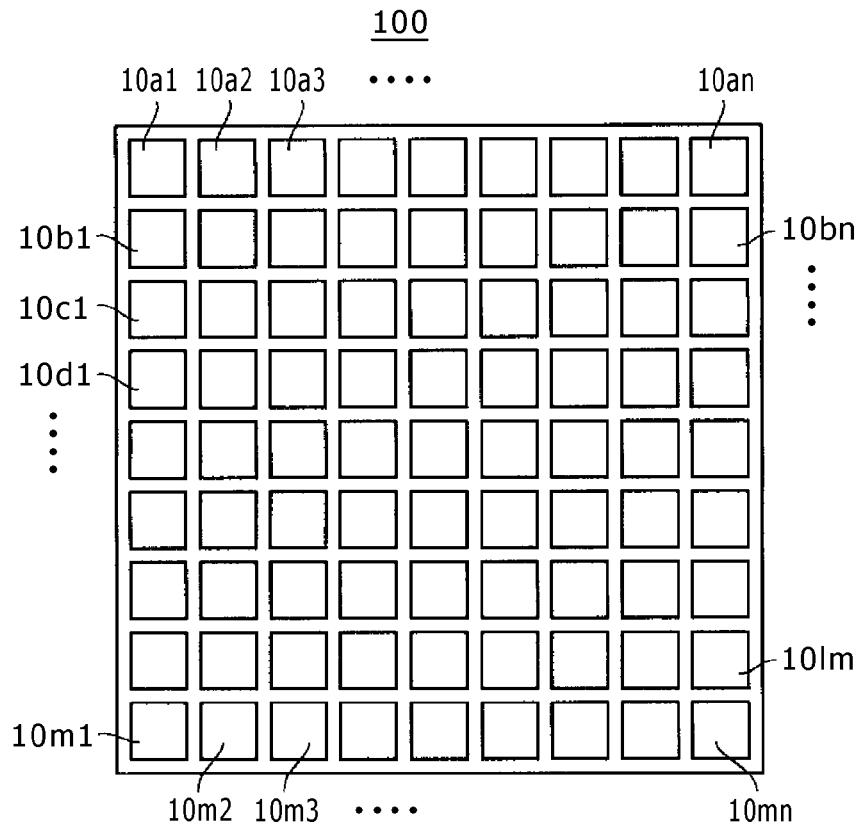
FIG. 3 is a top plan view of main portions of an infrared imaging device using the infrared sensing element according to the first embodiment.
Figure 4:
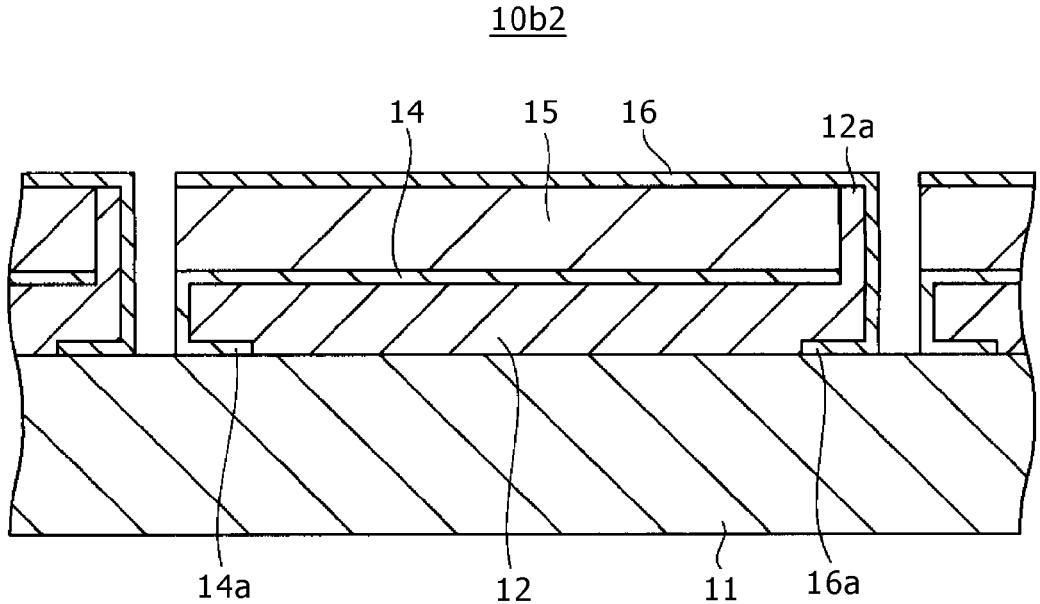
FIG. 4 is a cross sectional view of an example of the infrared sensing element used in the infrared imaging device shown in FIG. 3.

FIG. 3 is a schematic top plan view of an infrared imaging device 100 in which the infrared sensing elements 10 (10a1, 10a2, ..., 10b1, ..., 10c1, ..., 10mn) each having the same structure as that shown in FIG. 1 are arranged in an array of m×n, and for which the promotion of the multiple pixels of m×n is realized. In addition, FIG. 4 is a cross sectional view showing a structure of each of the infrared sensing elements 10a1 (10a2, ..., 10mn). In the examples show in FIG. 4, the supporting electrical insulating layer 12, the first electrode 14, the pyroelectric layer 15, and the second electrode 16 are formed on the substrate 11 similarly to the case of FIG. 1. Also, one end of the first electrode 14 extends on a side surface of the supporting electrical insulating layer 12, for example, on the substrate 11 side and is also connected to a terminal deriving portion 14a formed in a partial area between the substrate 11 and the supporting electrical insulating layer 12. In addition, in the other end located away from the side of the extension of the first electrode 14, the second electrode 16 similarly extends on the substrate 11 side, and is connected to a terminal deriving portion 16a, formed in a position different from that of the terminal deriving portion 14a, between the substrate 11 and the supporting electrical insulating layer 12. One of the terminal deriving portions 14a and 16a, for example, is grounded, and the other of the terminal deriving portions 14a and 16a is connected to a voltage converter, a switching circuit or the like (not shown) in an electric charge controlling portion which will be described later. Thus, the electric charges generated on the surface of each of the pyroelectric layers 15 is taken out in the form of a signal.

It is noted that in the portion in which the second electrode 16 extends, for example, an insulating layer 12a made of the same material as that of the supporting electrical insulating layer 12 may be formed between a side surface of the first electrode 14 and the pyroelectric layer 15, and the extension portion of the second electrode 16. In addition, a structure may also be adopted such that a space portion is provided between the side surface of the first electrode 14 and the pyroelectric layer 15, and the extension portion of the second electrode 16 by deposition of a sacrifice layer (not shown), etching removal or the like. Also, FIG. 4 shows the example in which the elements are separated from one another by utilizing a Reactive Ion Etching (RIE) (anisotropic etching) method or the like, thereby providing the space portion. However, for example, an element isolation layer made of the same material as that of the supporting electrical insulating layer 12, or an insulating material having a low thermal conductivity may also be formed between each adjacent two elements. Also, the supporting electrical insulating layer 12 may also be commonly provided so as to straddle over plural infrared sensing elements 10. When the insulating layer or the like is formed between each adjacent two infrared sensing elements 10 in such a manner, it is possible to suppress the vibration of each of the infrared sensing elements 10, and thus it is possible to increase the mechanical strength.

Since as described above, the light receiving area of each of the infrared sensing elements 10 (10a1, ..., 10mn) is reduced so as to fall in the range of $1\times10^2$ to $1\times10^4$ μm², even when several tends of thousands of the infrared sensing elements 10 are two-dimensionally arranged in an array, it is possible to miniaturize the size of the entire infrared imaging device. It is noted that although the example shown in FIG. 3 adopts the structure that the infrared sensing elements 10 are two-dimensionally arranged, a structure may also be adopted such that the infrared sensing elements 10 are one-dimensionally arranged in a line. Even when the infrared sensing elements 10 are arranged in one-dimensional array in such a manner, it is possible to miniaturize a size of the longest portion of the infrared imaging device. In addition, the pyroelectric layer 15 is by no means limited to the single layer structure. Thus, the pyroelectric layer 15 may also be provided in the form of two or more layers and may also adopt a lamination structure formed through the space portion or the like. In this case, it is possible to enhance the infrared ray absorbing efficiency for the light receiving area, and the higher output can be obtained at the excellent S/N ratio.

(2) Infrared Sensing Element of First Change (Structure that Intermediate Layer is Provided between Substrate and First Electrode)

Figure 5:
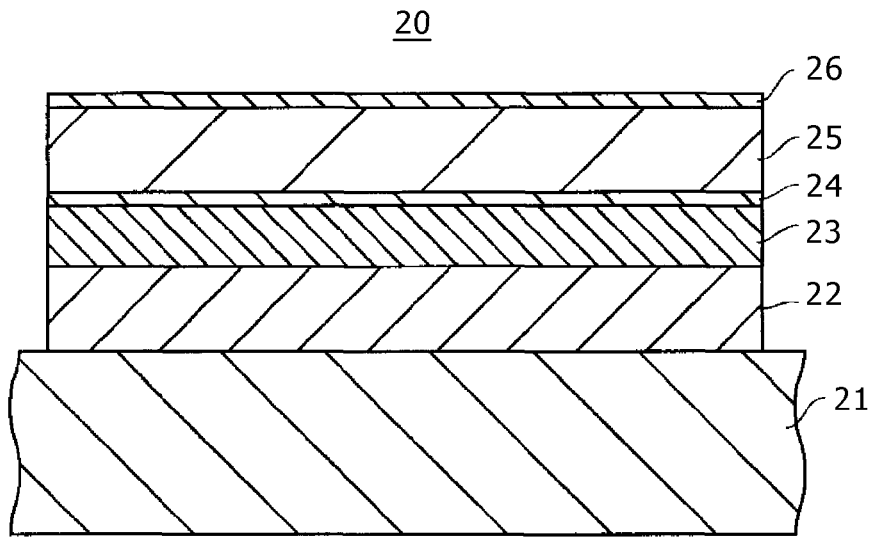
FIG. 5 is a cross sectional view of an infrared sensing element according to a first change of the first embodiment.

FIG. 5 is a cross sectional view showing a schematic structure of an infrared sensing element 20 according to a first change of the first embodiment. The infrared sensing element 20 has such a structure that a supporting electrical insulating layer 22, an intermediate layer 23, a first electrode 24, a pyroelectric layer 25, and a second electrode 26 are laminated in this order on a substrate 21. Preferably, a material which has a low thermal conductivity and is favorable for the crystal orientation is used for the intermediate layer 23. A MgO layer formed by utilizing either the CVD method or the sputtering method can be used as the layer having such a function. That is to say, the intermediate layer 23 made of MgO is disposed right below the first electrode 24, whereby the pyroelectric layer 25 is deposited on the first electrode 24 so that the crystal orientation properties are uniformed. As a result, the high pyroelectric property is obtained. In addition, since MgO is lower in thermal conductivity than the electrode material, MgO causes the heat to be hardly escaped. Thus, the pyroelectric property is held and the high sensitivity can be obtained. It is noted that in addition to MgO, a material can be utilized as the material of the intermediate layer 23 as long as the material is one other than a material which is low in thermal conductivity, and provides the excellent crystal orientation property for the pyroelectric layer 25.

The materials of the substrate 21, the supporting electrical insulating layer 22, the first electrode 24, the pyroelectric layer 25, and the second electrode 26, and the deposition methods thereof can be made identical to those in the case shown in FIG. 1. In addition, the light receiving area, the thickness and the composition of the pyroelectric layer 35 are made identical to those in the case shown in FIG. 1, whereby for the multiple pixel promotion by the miniaturization, the pyroelectric property can be sufficiently obtained and the piezoelectric noise can be suppressed. Also, several thousands to several tens of thousands of the infrared sensing elements 20 are arranged, thereby making it possible to capture the infrared image with the high resolution.

It is noted that when Pt is used as the material of the first electrode 24, the thickness of the first electrode 24 is made smaller than that of the intermediate layer 23 made of MgO, whereby the following effects are obtained. The thermal conductivity of Pt is $7.1 \times 10$ W·m$^{-1}$·K$^{-1}$, and the thermal conductivity of MgO is $5.9 \times 10$ W·m$^{-1}$·K$^{-1}$. Therefore, in the case where the intermediate layer 23 made of MgO is provided rather than the case where the entire portion between the pyroelectric layer 25 and the supporting electrical insulating layer 22 is composed of the first electrode 24 made of Pt, the heat is hardly escaped from the pyroelectric layer 25. In particular, the thickness of the intermediate layer 23 is made sufficiently larger than that of the first electrode 24, whereby the effect of suppressing the thermal conduction can be enhanced, the pyroelectric property can be held, and thus the high sensitivity can be obtained. When the thickness of the intermediate layer 23 is more than twice that of the first electrode 24, the effect of suppressing the thermal conduction can be sufficiently obtained. Specifically, the thickness of the intermediate layer 23 is preferably set as being equal to or larger than 50 nm. On the other hand, when the intermediate layer 23 is too thick, it takes long to deposit the intermediate layer 23. Therefore, the thickness of the intermediate layer 23 is preferably set as being equal to or smaller than 200 nm. As a result, it is possible to suppress the reduction of the pyroelectric property. In addition, since MgO is more inexpensive than Pt in terms of the material, it is also possible to reduce the cost.

(3) Infrared Sensing Element of Second Change (Structure that Space Portion is Provided)

Figure 6:
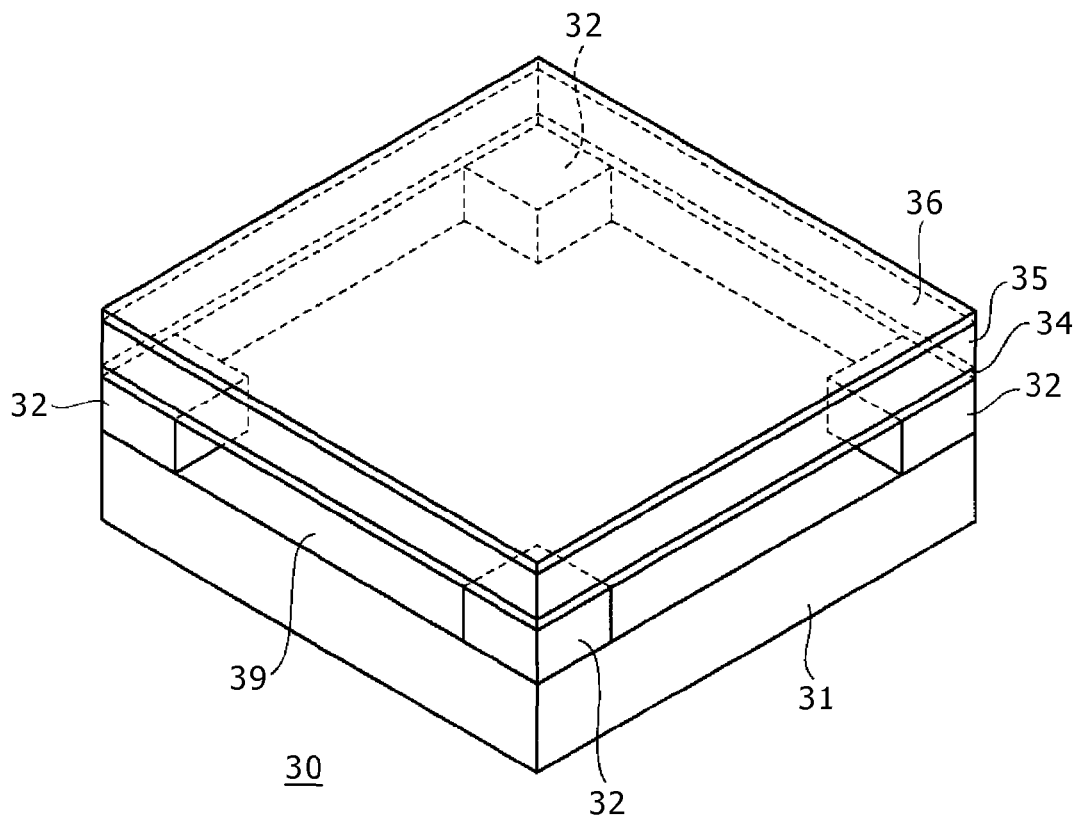
FIG. 6 is a perspective view of an infrared sensing element according to a second change of the first embodiment.

Next, a schematic structure of an infrared sensing element 30 according to a second change of the first embodiment will be described with reference to FIG. 6. As shown in FIG. 6, the infrared sensing element 30 has such a structure that a supporting electrical insulating layer 32, a first electrode 34, a pyroelectric layer 35, and a second electrode 36 are laminated in this order on a substrate 31. The materials of the substrate 31, the first electrode 34 and the second electrode 36, and the deposition methods thereof can be made identical to those in each of the cases shown in FIGS. 1 and 5. In addition, the light receiving area, the thickness and the composition of the pyroelectric layer 35 are made identical to those in each of the cases shown in FIGS. 1 and 5, whereby for the multiple pixel promotion by the miniaturization, the pyroelectric property can be sufficiently obtained and the piezoelectric noise can be suppressed.

On the other hand, the supporting electrical insulating layer 32, for example, are formed into prismatic shapes right below four corners of the first electrode 34 having a quadrangular shape in plain surface, respectively. A space portion 39 having a so-called cross shape in plain surface is defined among the supporting electrical insulating layers 32. That is to say, in this case, a hollow structure is obtained such that the space portion 39 is defined between the substrate 31 and the first electrode 34 right below the pyroelectric layer 35. Since by adopting such a hollow structure, the heat is hardly transmitted from the pyroelectric layer 35 to the substrate 31 through the supporting electrical layers 32, it is possible to enhance the thermal insulating property. Also, the thermal influence is suppressed, whereby the high sensitivity can be obtained without impairing the pyroelectric property. That is to say, the infrared image can be captured at the more superior sensitivity and with the high resolution in combination with that the light receiving area, the thickness and the material of the pyroelectric layer 35 are constituted as described above.

Figure 7A:
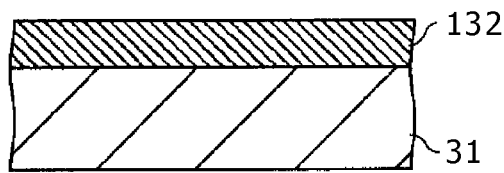
FIGS. 7A to 7F are cross sectional views, respectively, showing manufacturing processes in an example of a method of manufacturing the infrared sensing element shown in FIG. 6.
Figure 7B:
Figure 7C:
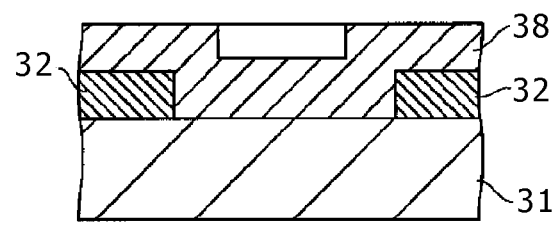

FIGS. 7A to 7F are cross sectional views showing manufacturing processes in a method of manufacturing the infrared sensing element 30 shown in FIG. 6, respectively. Firstly, as shown in FIG. 7A, an insulating layer 132 made of SiO$_2$ or Low Pressure Si(OC$_2$H$_5$)$_4$ (LP-TEOS) is deposited on the entire surface of the substrate 31 made of Si or the like by utilizing the CVD method or the like. Next, as shown in FIG. 7B, a portion of the insulating layer 132 in a region becoming the space portion 39 shown in FIG. 6 is removed away by utilizing the RIE method or the like, thereby forming the supporting electrical insulating layer 32 having the prismatic shape or the like, for example, as shown in FIG. 6. The shape of the supporting electrical insulating layer 32 is by no means limited to the prismatic shape. Thus, in addition thereto, a columnar shape, a columnar shape which is a polygon in plain surface, an un-uniform shape or the like can be suitably selected for the supporting electrical insulating layer 32. Next, as shown in FIG. 7C, a sacrifice layer 38 is deposited over the entire surface including a surface of the columnar supporting electrical insulating layer 32 by utilizing the CVD method or the like. A material of the sacrifice layer 38 has to have etching selectivity with the material of the supporting electrical insulating layer 32, and thus poly-Si or the like, for example, can be utilized. It is noted that after completion of the deposition of the sacrifice layer 38, a heat treatment may be suitably carried out. Carrying out the heat treatment results in that the film quality of the sacrifice layer 38 is improved, and it is possible an influence exerted on the crystal orientation of the pyroelectric layer 35 deposited on the sacrifice layer 38 through the first electrode 34.

Figure 7D:
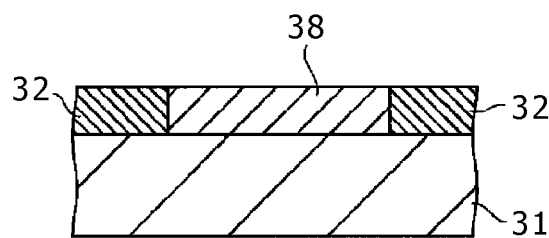
Figure 7E:
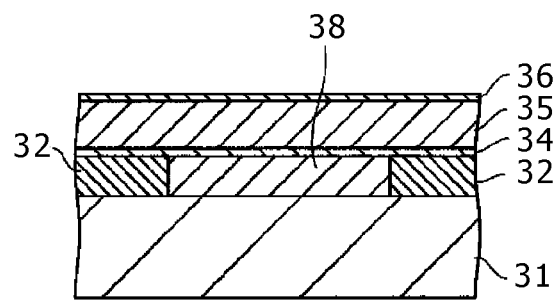
Figure 7F:
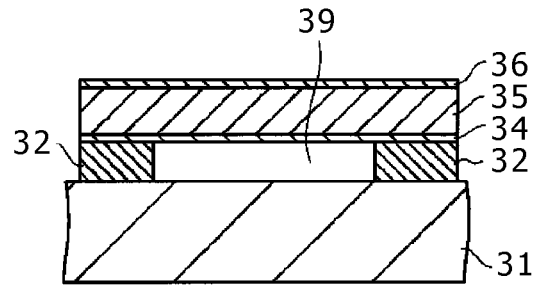

Next, as shown in FIG. 7D, a planarizing treatment for causing an upper surface of the sacrifice layer 38 and an upper surface of the supporting electrical insulating layer 32 to be approximately flash with each other is carried out by utilizing a Chemical Mechanical Polishing (CMP) method or the like. Also, as shown in FIG. 7E, the first electrode 34 made of Pt or the like is deposited on the sacrifice layer 38 and the supporting electrical insulating layer 32 which have been planarized by utilizing the sputtering method or the like. Subsequently, the pyroelectric layer 35 is deposited on the first electrode 34 by utilizing the CVD method or the like. The material and thickness of the pyroelectric layer 35 are made identical to those in the case described with reference to FIG. 1 or the like. In addition, the second electrode 36 made of Pt or the like is deposited on the pyroelectric layer 35. Next, as shown in FIG. 7F, the sacrifice layer 38 is etched away by using xenon fluoride or the like, thereby forming the space portion 39 among the supporting electrical insulating layers 32. Finally, the supporting electrical insulating layer 32, the first electrode 34, the pyroelectric layer 35, and the second electrode 36 for one pixel are patterned by utilizing the RIE method or the like, thereby forming the infrared sensing element having the pattern of the quadrangular shape in plain surface, for example, shown in FIG. 6. By carrying out the processes described above, it is possible to form plural infrared sensing elements 30 each shown in FIG. 6 on the substrate 31.

Figure 8:
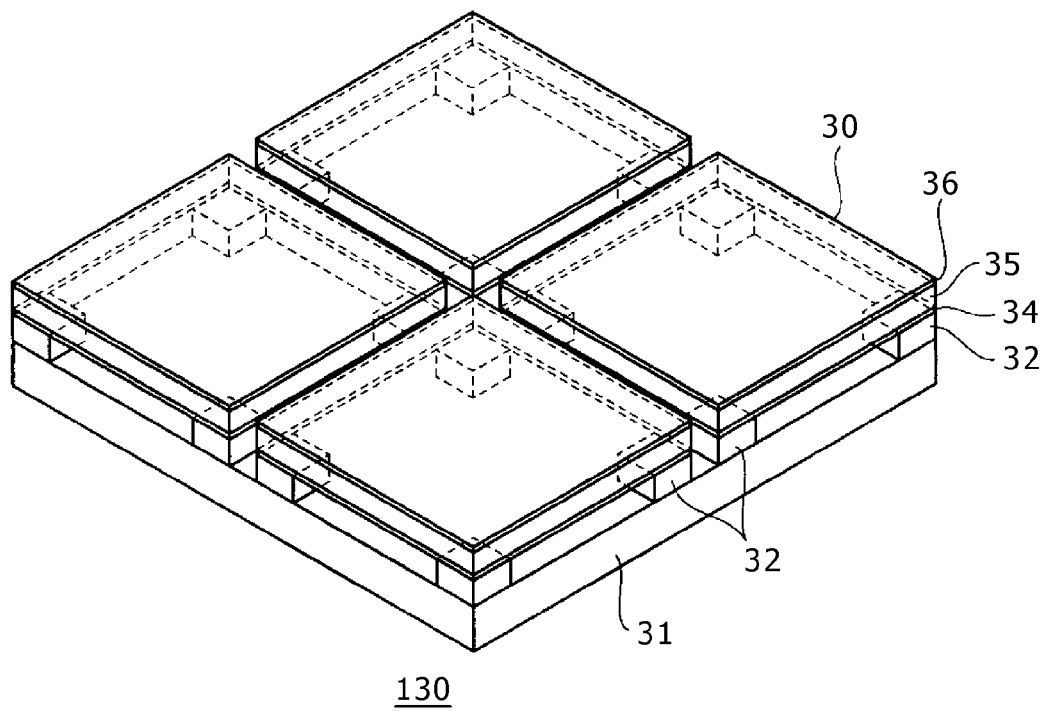
FIG. 8 is a perspective view of an infrared imaging device using the infrared sensing element shown in FIG. 6.

FIG. 8 shows an example in which plural infrared sensing elements 30 are arranged on the substrate 31. Although only four elements in total of 2 row×2 column are shown in FIG. 8, the present invention is by no means limited thereto. That is to say, several thousands to several tens of thousands of the infrared sensing elements 30 can be arranged. It is noted that although the example shown in FIG. 8 shows the case where the supporting electrical insulating layers 32 each becoming a pillar are separated from one another every one pixel, the present embodiment is by no means limited thereto. That is to say, one columnar supporting electrical insulating layer 32 may also be commonly provided so as to straddle over plural pixels. In this case, since the width of the columnar supporting electrical insulating layer 32 can be made large, the mechanical strength can be increased. In addition, the vibration of any of the infrared sensing elements 30 can also be suppressed.

Figure 9:
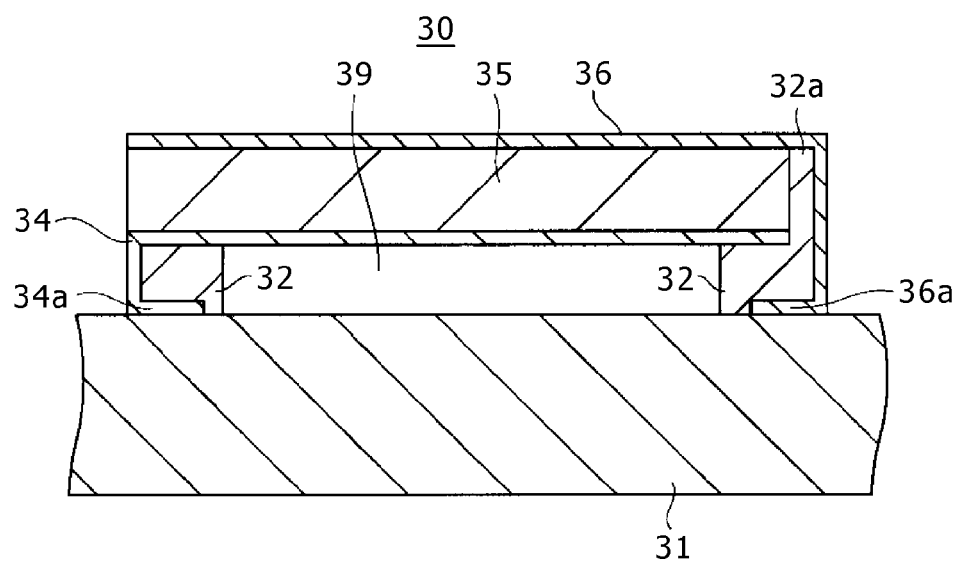
FIG. 9 is a cross sectional view of an example of the infrared sensing element shown in FIG. 6.

It is noted that, for example, as shown in FIG. 9, extension portions and terminal deriving portions 34a and 36a which are the same as those described in the case shown in FIG. 4 may be provided in the first electrode 34 and the second electrode 36, respectively. In FIG. 9, portions corresponding to those in FIGS. 6 to 8 are designated by the same reference symbols, respectively, and a repeated description thereof is omitted here for the sake of simplicity. The extension portion for the substrate 31, for example, may be disposed so as to contact a side surface of any one of the supporting electrical insulating layers 32. In addition, an extension electrode 32a made of the an insulating material identical to the material of the supporting electrical insulating layer 32, or the like may be provided between the extension portion for the terminal deriving portion 36a of the second electrode 36, and the pyroelectric layer 35 and the first electrode 34. Or, instead, a space portion may also be provided by utilizing a sacrifice layer. In this case, for example, it is only necessary to previously form the terminal deriving portions 34a and 36a on the substrate 31 before the process shown in FIG. 7E. In addition, it is only necessary that the extension portion of the first electrode 34 is temporarily formed after completion of the deposition of the first electrode 34 of the process shown in FIG. 7E, and thereafter a process for forming the extension portion 32a of the supporting electrical insulating layer 32, and the extension portion of the second electrode 36 is added so as to follow the process shown in FIG. 7F.

The supporting electrical insulating layer 32 formed in such a manner is disposed in a lower portion of the pyroelectric layer 35, in a matter of speaking, is provided right below the pixel, thereby obtaining a structure with which the pixel is supported from the lower side. For this reason, unlike a bridge structure in which a side surface of an infrared sensing element protrudes as described in Japanese Patent Nos. 3,608,298 and 3,763,822, the rigidity of the entire infrared sensing element 30 is held. That is to say, in the bridge structure described in Japanese Patent Nos. 3,608,298 and 3,763,822, the bridge is connected to the side surface of the infrared sensing element from a lateral direction, and the entire infrared sensing element is supported by the bridge. Thus, no supporting portion is provided right below the infrared sensing electrode. For this reason, the entire infrared sensing electrode is easy to bend by an influence of a vibration or the like. When the entire infrared sensing element is bent, a piezoelectric output noise due to a strain stress is generated in a pyroelectric layer. Therefore, when such a bridge structure is adopted in the pyroelectric type infrared sensing element, it is difficult to enhance the S/N ratio.

On the other hand, when plural supporting electrical insulating layers 32 are provided in the lower surface of the infrared sensing element 30 as shown in FIG. 6, the deflection is hardly generated because the rigidity of the infrared sensing element 30 is held. That is to say, it is possible to suppress the vibration itself of the infrared sensing element 30. For this reason, it is possible to suppress the piezoelectric output noise due to the strain stress in the pyroelectric layer 35, and thus it is possible to increase the S/N ratio.

In addition, when the columnar supporting electrical insulating layers 32 are provided only in the lower portion in such a manner, unlike the case where the bridge structure is adopted, it is possible to omit an area necessary for the supporting structure provided in the circumference, and the bridge structure. For this reason, there is obtained such an advantage that it is possible to substantially increase the effective pixel area with which the infrared ray is received, and it is also possible to increase the output obtained within the same substrate area.

Also, when the bridge structure is adopted in the pyroelectric type infrared sensing element, the entire infrared sensing element is deformed by the heating for obtaining the polarization state in some cases. Thus, when a large number of infrared sensing elements are arranged, there is caused a problem that the dispersion is generated in the infrared sensing elements, and thus the rejection rate becomes large. A heat treatment for obtaining the polarization state for the pyroelectric material is normally carried out at a temperature of 100 to 250° C. for about 5 to about 30 minutes. It is noted that in the case where as well where the pyroelectric material other than the compound expressed by $Pb(Zr_xTi1-x)O3$ is used, the same heat treatment is required. Therefore, when the bridge structure as described in Japanese Patent No. 3,608,298 is directly applied to the pyroelectric type infrared sensing element, there is the possibility that the bridge structure is deformed and the entire pyroelectric type infrared sensing element is inclined by the heating, that is, the light receiving area is inclined. In the case where a large number of infrared sensing elements are arranged, when a partial light receiving area is inclined, the incidence angle of the incident light is dispersed between each adjacent two pixels, in a manner of speaking, the effective light receiving areas become non-uniform, and thus it may be difficult to precisely obtain the infrared image.

On the other hand, the supporting electrical insulating layers 32 are formed into the columnar structures to be disposed right below the pyroelectric layer 35 as shown in FIG. 6, whereby it is possible to suppress or avoid such deformation caused by such heating for obtaining the polarization state. Therefore, even when several thousands to several tens of thousands of the infrared sensing elements 30 are disposed, the pyroelectric properties can be uniformized, the rejection rate can be suppressed, and the productivity of the infrared imaging devices can be enhanced.

Exemplifying the preferred shape and disposition of the supporting electrical insulating layer 32, for example, when the pyroelectric layer 35 is 3 µm in thickness and 300 µm$^2$ in light receiving area (surface area), the supporting electrical insulating layer 32 becoming the pillar can have a prismatic shape which is 3 µm in width and is a square in cross section. The pyroelectric layer 35 is made to have a quadrangle in planar shape and such columnar supporting electrical insulating layers 32 are provided right below the four corners of the pyroelectric layer 35, whereby the strain due to the vibration or the like can be sufficiently suppressed and the piezoelectric output can be negligibly suppressed. It is noted that when a ratio of the area with which the supporting electrical insulating layer 32 contact the first electrode 34 to the light receiving area is made large, the pyroelectric property is reduced due to the thermal conduction of the supporting electrical insulating layer 32. On the other hand, when the ratio is too small, the effect of reducing the piezoelectric property due to the strain suppression is not sufficiently obtained. As a result of the examination, it was found out that when the light receiving area of the pyroelectric layer 35 is set in the range of $1 \times 10^2$ to $1 \times 10^4$ µm$^2$, and the thickness thereof is set in the range of 0.8 to 10 µm, that ratio is set in the range of 0.1 to 0.4, whereby the pyroelectric property can be sufficiently ensured and the noise due to the piezoelectric property can be suppressed.

The planar shape and disposition of the supporting electrical insulating layer 32 becoming the pillar can be suitably selected irrespective of the light receiving area. For this reason, when the light receiving area is relatively wide and thus the deflection is easy to generate, for example, a structure may also be adopted such that the supporting electrical insulating layer 32 is disposed at the center as well of the light receiving area to further suppress the vibration.

In the example as well, the intermediate layer 23 as shown in FIG. 5 may be contained as the supporting electrical insulating layer 32. For example, an intermediate layer (not shown) made of MgO is interposed between the lower portion of the supporting electrical insulating layer 32 made of SiO$_2$ or the like, and the substrate 31, whereby the thermal insulating property can be enhanced and the crystal orientation of the pyroelectric layer 35 formed above the intermediate layer can be made excellent. As a result, it is possible to further enhance the pyroelectric property and it is possible to enhance the sensitivity.

(4) Infrared Sensing Element of Third Change (Structure that Electrode is Formed to Have Two Layers)

Figure 10:
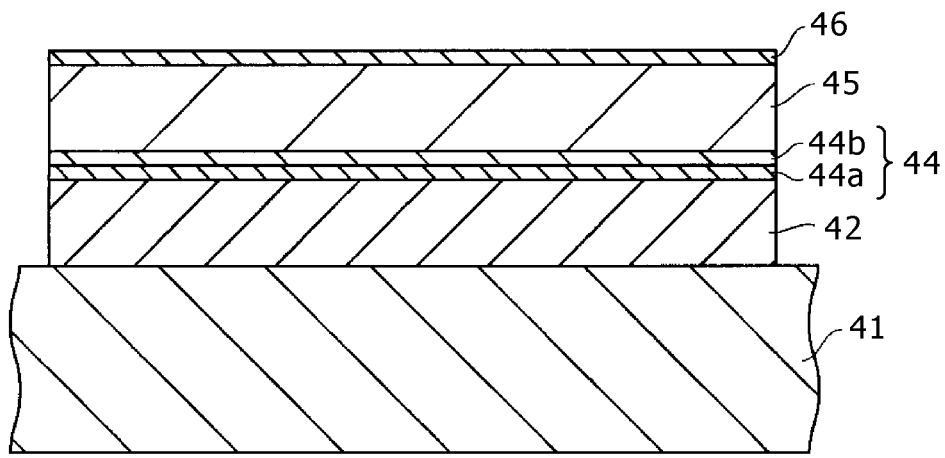
FIG. 10 is a cross sectional view of an infrared sensing element according to a third change of the first embodiment.

Next, a description will be given with respect to an infrared sensing element 40 according to a third change of the first embodiment with reference to FIG. 10. In this case, as shown in FIG. 10, a supporting electrical insulating layer 42, a first electrode 44, a pyroelectric layer 45, and a second electrode 46 are formed in this order on a substrate 41. Materials of the substrate 41, the supporting electrical insulating layer 42, and the second electrode 46 can be made identical to those in the case shown in FIG. 1 or the like. In addition, a material, a thickness and a light receiving area of the pyroelectric layer 45 are also made identical to those in the case shown in FIG. 1 or the like, whereby for the promotion of the multiple pixels by the miniaturization, the pyroelectric property can be sufficiently obtained, and the piezoelectric noise can be suppressed. Several thousands to several tens of thousands of the infrared sensing elements 40 are arranged, thereby making it possible to capture the infrared image with the high resolution.

Also, in this case, a two-layer structure that, for example, a base layer 44a made of Ti, TiO$_2$ or the like, and a Pt layer 44b are deposited in this order is adopted for the first electrode 44. In the case where a Si series material is used for the supporting electrical insulating layer 42, when the Pt layer 44b is directly deposited on the supporting electrical insulating layer 42, it is difficult to obtain an excellent joining property. On the other hand, the base layer 44a made of Ti, TiO$_2$ or the like is deposited by utilizing the sputtering method or the like to be interposed between the Pt layer 44b and the supporting electrical insulating layer 42, thereby making it possible to improve the joining property. It is noted that even when the intermediate layer 23 made of MgO or the like is provided between the supporting electrical insulating layer 22 and the first electrode 24 as with the first change of the first embodiment shown in FIG. 5, similarly, the base layer made of Ti, TiO$_2$ or the like may also be provided in the first electrode 24, thereby making it possible to improve the joining property.

In addition, even when the hollow structure is adopted as shown in FIG. 6, the first electrode 34 may also be formed to have the two-layer structure in such a manner. In any case, the thickness of the base layer 44a is set in the range of 10 to 200 nm, whereby it is possible to absorb a minute stepped portion of a surface of the supporting electrical insulating layer 42 underlying the base layer 44a. For this reason, it is possible to suppress an influence exerted on the crystal orientation of the pyroelectric layer 45 formed on the base layer 44a through the Pt layer 44b, and thus it is possible to suppress the reduction of the pyroelectric property.

According to the third change of the first embodiment, the joining property of the first electrode 44 with the supporting electrical insulating layer 42 can be made excellent. Therefore, it is possible to suppress generation of a trouble such as peeling, and it is possible to suppress the dispersion of the shapes when a large number of infrared sensing elements 40 are arranged. For this reason, even when the infrared sensing elements 40 for several hundreds to several tens of thousands of the pixels are disposed, the non-uniformity of the pyroelectric properties due to the disposition of the shapes can be suppressed, the rejection rate can be suppressed, and the productivity of the infrared imaging devices can be enhanced.

(5) Infrared Sensing Element of Fourth Change (Structure that Infrared Absorbing Film is Provided)

Figure 11:
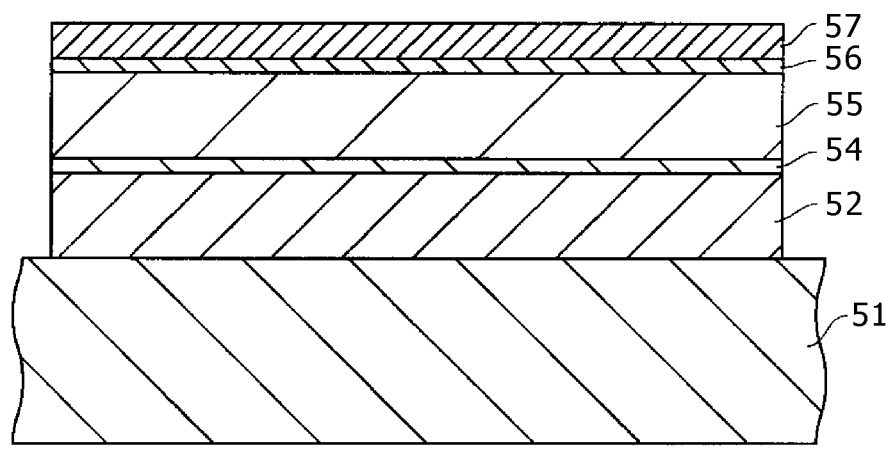
FIG. 11 is a cross sectional view of an infrared sensing element according to a fourth change of the first embodiment.

Next, a description will be given with respect to an infrared sensing element 50 according to a fourth change of the first embodiment with reference to FIG. 11. In this case, as shown in FIG. 11, a supporting electrical insulating layer 52, a first electrode 54, a pyroelectric layer 55, and a second electrode 56 are formed in this order on a substrate 51. Materials and forming methods of the substrate 51, the supporting electrical insulating layer 52, and the first and second electrodes 54 and 46 can be made identical to those in the case shown in FIG. 1 or the like. In addition, a material, a thickness and a light receiving area of the pyroelectric layer 55 are also made identical to those in the case shown in FIG. 1 or the like, whereby the noise due to the piezoelectric can be suppressed, the pyroelectric property can be sufficiently obtained, and the infrared image can be captured with the high sensitivity. Also, in the fourth change of the first embodiment, an infrared absorbing layer 57 is provided on the second electrode 56. A material whose surface emissivity, for example, is equal to or larger than 60%, is preferably equal to or larger than 75%, and is more preferably equal to or larger than 90% is preferably used as a material of the infrared absorbing layer 57. An organic dye, an organic solvent soluble dye, an oil soluble dyestuff, a dispersive dye, a static dye, a photochromic dye, a far-infrared absorbing resin composition, a far-infrared absorbing ink, a far-infrared absorbing coating material or the like, for example, is given as the material whose surface emissivity is equal to or larger than 60%. In addition thereto, a cyanine dye aluminium salt type compound, a metallic complex compound, an anthraquinone series compound, a phthalocyanine class, a naphthalocyanine or the like can also be utilized as the material whose surface emissivity is equal to or larger than 60%. Provision of such an infrared absorbing layer 57 results in that the efficiency of absorbing the infrared ray can be increased and the sensitivity can be further enhanced. It is noted that the structure that the infrared absorbing layer 57 is provided in such a manner can be applied to each of the cases described with reference to FIG. 1, and FIGS. 4 to 10, and thus the sensitivity can be similarly further enhanced.

2. Second Embodiment

Infrared Imaging Device (1) Basic Configuration of Infrared Imaging Device

Figure 12:
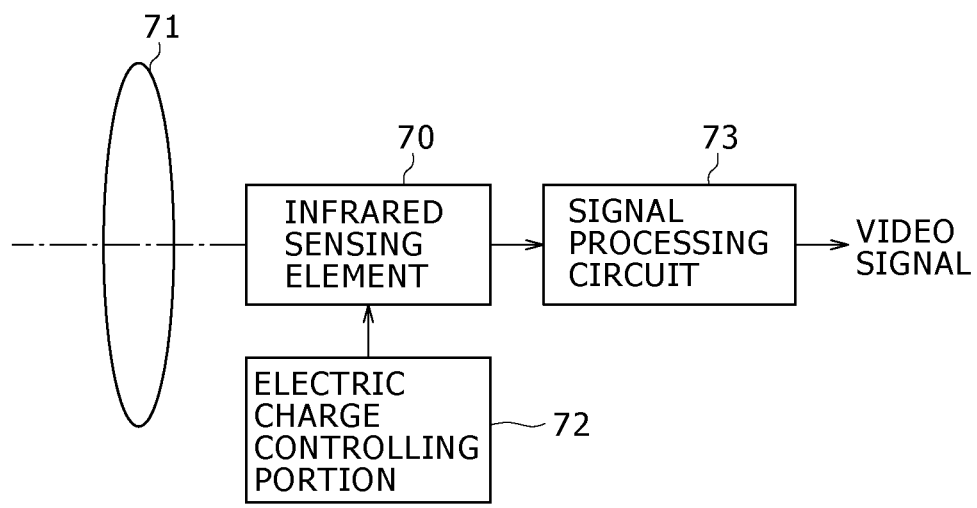
FIG. 12 is a block diagram of an infrared imaging device according to a second embodiment.

Next, an infrared imaging device according to a second embodiment will be described with reference to FIG. 12. FIG. 12 is a schematic block diagram showing a basic configuration of the infrared imaging device 200 according to the second embodiment. The infrared imaging device 200 includes an infrared sensing element 70 and a light condensing portion 71. In this case, although the infrared sensing element 70 corresponds to the infrared sensing element 10 according to the first embodiment, any of the infrared sensing elements according to the first to fourth changes of the first embodiment may also be used as the infrared sensing element 70. Also, the light condensing portion 71 condenses the infrared ray from the outside to the infrared sensing element 70. In addition, the infrared imaging device 200 includes an electric charge controlling portion 72 and a signal processing circuit 73. In this case, the electric charge controlling portion 72 controls output of electric charges obtained by radiating the infrared ray to the infrared sensing element 70, that is, controls storage, discharge and the like of the electric charges. Also, the signal processing circuit 73 converts an output from the infrared sensing element 70 into a signal, thereby obtaining a video (image) signal based on an infrared image.

The light condensing portion 71 is especially by no means limited as long as the light condensing portion 71 condenses the infrared ray or the like from an object whose image is to be captured, and forms an image corresponding to the infrared ray. In this case, one sheet of lens may be used as the light condensing portion 71 or a lens group including two or more sheets of lenses may also be used as the light condensing portion 71. Or, the light condensing portion 71 may also be structured so as to include a lens array in which a microlens (microlenses) corresponding to one pixel or plural pixels is (are) arranged. A Ge lens, a Si lens or the like is given as a lens material for condensing of the infrared ray.

The infrared ray condensed by the light condensing portion 71 is received in the infrared sensing element 70. However, when the object whose image is to be captured is held stopped, a temperature change due to a change in quantity of received infrared ray is not caused, none of the electric charges is generated, and thus an infrared image cannot be acquired. For this reason, a chopper for periodically controlling the incident infrared ray may be provided between the infrared sensing element 70 and the object whose image is to be captured. Also, a driving circuit (not shown) drives the chopper in accordance with control made by the electric charge controlling portion 72 to modulate the infrared ray, thereby making the infrared ray having a specific angular frequency incident to the infrared sensing element 70. As a result, even when the object whose image is to be captured is held stopped, the temperature change is caused so as to correspond to a quantity of resulting infrared ray to generate the electric charges to which an infrared image corresponds, thereby making it possible to obtain the video signal (image signal). A shutter mechanism for mechanically opening and closing, a mechanism for electrically controlling a transmission area and a blocking area for the infrared ray as with a liquid crystal shutter, or the like, for example, can be utilized as the chopper.

It is noted that a drive period of the chopper (shutter) corresponds to a frame rate of the imaging system. Although in the case of 30 fps, it is basic to operate the shutter at 30 Hz, the shutter may be operated at a double speed, a quadruple speed, or an octuplet speed like 60, 120 or 240 Hz. When the outputs averaged in such a manner are obtained every frame rate, the unexpected noises are averaged to be canceled, thereby making it possible to obtain stable output data. In addition, it is also possible to respond to a high-speed frame rate in a recent TV. It is noted that in the case where detection of a static object whose image is to be captured can be excluded such as the case where the infrared imaging device 200 is provided in a movable body, a configuration may also be adopted such that no chopper is provided and the infrared ray is directly sensed.

The electric charges generated so as to correspond to an image of the object to be captured in such a manner are successively controlled synchronously with an operation of the chopper in accordance with a start pulse, a clock pulse or the like generated from a timing generator provided in the electric charge controlling portion 72 to be outputted to the signal processing circuit 73.

The signal processing circuit 73 has an electric charge-to-voltage converting circuit, a noise correcting circuit, an analog-to-digital converting circuit, and the like. Also, the signal processing circuit 73 executes signal processing such as correlation-double sampling for an output signal from the infrared sensing element 70. The video signal is recorded in a recording medium (not shown) such as a memory as may be necessary, and an infrared image corresponding to the video signal is displayed on a monitor such as a liquid crystal display device.

As described above, in the infrared sensing element 70 used in the infrared imaging device 200 according to the second embodiment, the light receiving area of the pyroelectric layer is set in the range of $1\times10^2$ to $1\times10^4$ $\mu m^2$, and the thickness thereof is set in the range of 0.8 to 10 $\mu m$. Also, the composition mole ratio x of the compound material as the principal component is set in the range of $0.57<x<0.93$ in Composition Formula (1) described above. As a result, several thousands to several tens of thousands of the pixels can be arranged. Also, although the infrared sensing element 70 is miniature and thin, the sufficient pyroelectric property can be obtained, and the electric charges can be generated with the excellent S/N ratio while the piezoelectric noise is suppressed. As a result, it is possible to obtain the video signal based on the infrared image with the high sensitivity and with the high resolution.

(2) Infrared Imaging Device of First Change (Configuration that Temperature Controlling Portion is Provided)

Figure 13:
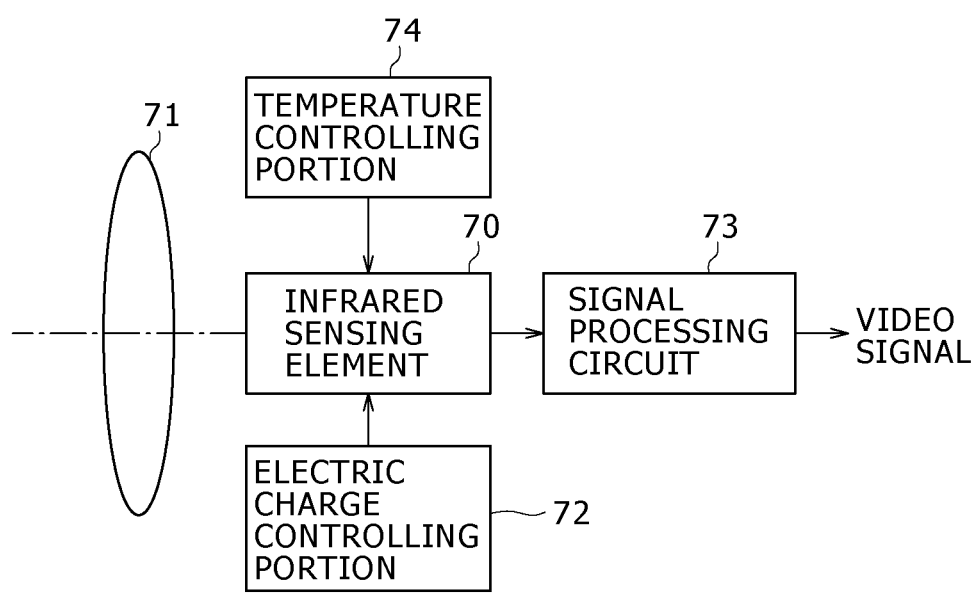
FIG. 13 is a block diagram of an infrared imaging device according to a first change of the second embodiment.

Next, an infrared imaging device 300 according to a first change of the second embodiment will be described with reference to FIG. 13. In the case shown in FIG. 13, a temperature controlling portion 74 for controlling a temperature of the infrared sensing element 70 is additionally provided in the infrared imaging device 200 shown in FIG. 12. In FIG. 13, portions corresponding to those in FIG. 12 are designated by the same reference symbols, respectively, and a repeated description thereof is omitted here for the sake of simplicity.

The compound composing the pyroelectric layer 15 (25, 35, . . . ) formed in accordance with Composition Formula (1) described above has a perovskite crystal structure. For this reason, phase transition occurs in a crystal phase in the vicinity of a boundary between a low-temperature phase and a high-temperature phase of a Ferroelectric Rhombohedral phase by controlling the temperature of the infrared sensing element. The pyroelectric property can be further enhanced in the vicinity of the phase transition temperature, and thus the sensitivity is increased. Therefore, the high-performance infrared imaging device is obtained in which by controlling the temperature of the pyroelectric layer 15 to the vicinity of the phase transition temperature, the pyroelectric property can be reliably ensured, and the piezoelectric noise can be sufficiently suppressed, and thus which has the high sensitivity.

FIG. 14 is a graph representing a change in pyroelectric coefficient against a temperature when the composition mole ratio x is set as 0.4 in Composition Formula (1) described above. When the composition mole ratio x is set as 0.4, it is understood that at a temperature of 40° C., the phase transition occurs and the pyroelectric coefficient gets a maximum value. That is to say, in this case, it is understood that it is only necessary to carry out either cooling or heating so that the temperature of the infrared sensing element 70 becomes close to 40° C. For example, when a maximum value of an intra-apparatus of the infrared imaging device 3 is 80° C., the temperature controlling portion 74 such as a water-cooling or air-cooling mechanism including a cooling function adapted for −40° C. is provided, whereby the pyroelectric coefficient is made close to the maximum value, and thus the higher pyroelectric property can be obtained. Contrary to this, the composition of the pyroelectric layer 15 (25, 35, . . . ) within the infrared sensing element 70 may be selected in consideration of the intra-apparatus temperatures and the performance, the cost and the like of the temperature controlling portion 74. In this case, the maximum pyroelectric property can be obtained without using an expensive cooling mechanism. The suitable temperature controlling portion 74 is provided so as to correspond to the pyroelectric layer 15 (25, 35, . . . ) of the infrared sensing element 70, whereby the pyroelectric property can be sufficiently ensured, the piezoelectric noise can be suppressed, and thus the video signal based on the infrared image can be obtained with the high sensitivity and with the high resolution.

3. Concrete Examples

Next, a description will be given with respect to output examples in the infrared sensing elements according to examples of the first embodiment, and the infrared sensing elements according to comparative examples. The output examples are obtained in the form of output waveform charts when the infrared sensing elements 10 having the structures shown in FIGS. 1, 3 and 4, respectively, are each provided in the infrared imaging device 200 shown in FIG. 12. The composition mole ratio x in Composition Formula (1) described above of the pyroelectric layer 15 in each of the infrared sensing elements 10 was set as 0.6. In addition, the light receiving area of the pyroelectric layer 15 was 200 μm2 and the thickness thereof was 3 μm. In addition, the composition mole ratio x in Composition Formula (1) described above of the pyroelectric layer of each of the infrared sensing element according to the comparative examples was set as 0.4, and the light receiving area and the thickness thereof were made identical to those of the pyroelectric layer 15 of each of the infrared sensing elements 10 according to the examples. In both the examples and the comparative examples, a Peltier element whose temperature was set as 40° C. was used as a heat source of a detection object. FIG. 15A shows a waveform from one pixel in the infrared imaging device according to each of the examples, and FIG. 15B shows a waveform from one pixel in each of the comparative examples. From the waveform charts shown in FIGS. 15A and 15B, it is understood that the output signal having the large S/N ratio is obtained in the infrared imaging device using the infrared sensing element having the structure of the present invention. On the other hand, it is understood that in each of the comparison examples, a noise output is large, and thus the excellent S/N ratio is not obtained.

It is noted that in the first and second embodiments of the present invention described above, the compound whose composition is expressed by $Pb(Zr_xTi_{1-x})O_3$ ($0.57<x<0.93$) is used in the pyroelectric layer of the infrared sensing element. On the other hand, it is understood that in the case as well where a compound is used in which Zr is replaced with Ba, Cd, Sr or Sn, similarly, the range of a suitable composition mole ratio x is selected, whereby similarly, the piezoelectric output can be suppressed, the sufficient pyroelectric property can be obtained, and thus the infrared image can be obtained with the high sensitivity and with the high resolution.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An infrared sensing element comprising:
   a substrate;
   a supporting electrical insulating layer formed on the substrate;
   a first electrode formed on the supporting electrical insulating layer;
   a pyroelectric layer formed on the first electrode;
   an insulating layer formed on a side surface of the first electrode and the pyroelectric layer; and
   a second electrode directly formed on the pyroelectric layer and the insulating layer, one end of the second electrode extending on a side surface of the insulating layer to be connected to a terminal deriving portion formed between the substrate and the supporting electrical insulating layer,
   wherein the pyroelectric layer has a light receiving area of $1 \times 10^2$ to $1 \times 10^4$ μm$^2$, has a thickness of 0.8 to 10 μm, and contains therein a compound expressed as Pb($Zr_x Ti_{1-x}$)$O_3$, where $0.57 < x < 0.93$ as a principal component.

2. The infrared sensing element according to claim 1, wherein an intermediate layer whose thermal conductivity is lower than that of a material of the first electrode is provided between the supporting electrical insulating layer and the first electrode.

3. The infrared sensing element according to claim 2, wherein the intermediate layer is made of MgO formed by utilizing either a chemical vapor deposition method or a sputtering method.

4. The infrared sensing element according to claim 2, wherein a thickness of the intermediate layer is larger than that of the first electrode.

5. The infrared sensing element according to claim 1, wherein the supporting electrical insulating layer is provided commonly to a plurality of infrared sensing elements.

6. The infrared sensing element according to claim 1, wherein a space portion is formed in a part of the supporting insulating electrical layer.

7. The infrared sensing element according to claim 6, wherein the space portion is formed right below a central portion of the pyroelectric layer.

8. The infrared sensing element according to claim 1, wherein the first electrode includes at least a Pt layer.

9. The infrared sensing element according to claim 8, wherein the first electrode is composed of a base material made of either Ti or $TiO_2$, and a Pt layer formed on the base layer.

10. The infrared sensing element according to claim 9, wherein a thickness of the base layer is in a range of 10 to 200 nm.

11. The infrared sensing element according to claim 1, further comprising an infrared absorbing film on an upper portion of the second electrode.

12. The infrared sensing element according to claim 11, wherein the infrared absorbing film is made of an organic material whose surface emissivity is equal to or larger than 60%.

13. An infrared imaging device comprising:
plural pyroelectric type infrared sensing elements;
a light condensing portion configured to condense an infrared ray to the plural pyroelectric type infrared sensing elements;
an electric charge controlling portion configured to control output of electric charges obtained in the plural pyroelectric type infrared sensing elements by radiation of the infrared ray; and
a signal processing circuit for converting outputs from the plural pyroelectric type infrared sensing elements into signals, thereby obtaining an infrared image,
each of the plural pyroelectric type infrared sensing elements, including
a substrate,
a supporting electrical insulating layer formed on the substrate,
a first electrode formed on the supporting electrical insulating layer, a pyroelectric layer formed on the first electrode,
an insulating layer formed on a side surface of the first electrode and the pyroelectric layer; and
a second electrode directly formed on the pyroelectric layer and the insulating layer, one end of the second electrode extending on a side surface of the insulating layer to be connected to a terminal deriving portion formed between the substrate and the supporting electrical insulating layer,
wherein the pyroelectric layer has a light receiving area of $1 \times 10^2$ to $1 \times 10^4$ μm$^2$, has a thickness of 0.8 to 10 μm, and contains therein a compound expressed as Pb($Zr_x Ti_{1-x}$)$O_3$, where $0.57 < x < 0.93$ as a principal component.

14. The infrared imaging device according to claim 13, further comprising
a temperature controlling portion configured to control a temperature of each of the plural pyroelectric type infrared sensing elements.

15. The infrared imaging device according to claim 14, wherein the temperature is controlled so as to be close to a temperature of a phase transition between a low-temperature phase and a high-temperature phase of a ferroelectric rhombohedral phase in a material of the pyroelectric layer.

* * * * *